United States Patent [19]

Urbach et al.

[11] 4,130,898
[45] Dec. 19, 1978

[54] MOTION BLUR COMPENSATION FOR MOVING MEDIA OPTICAL DATA RECORDING SYSTEM

[75] Inventors: John C. Urbach, Portola Valley; David Cheng, Palo Alto, both of Calif.

[73] Assignee: Xerox Corporation, Stamford, Conn.

[21] Appl. No.: 828,801

[22] Filed: Aug. 29, 1977

[51] Int. Cl.² .................... G11C 13/08; G11C 7/00
[52] U.S. Cl. ..................... 365/215; 179/100.3 G; 358/128; 365/120; 365/234
[58] Field of Search ............ 365/106, 120, 127, 215, 365/234; 179/100.3 G, 100.3 V; 358/128

[56] References Cited

U.S. PATENT DOCUMENTS

| 3,774,172 | 11/1973 | Silverman | 179/100.3 G |
| 4,051,528 | 9/1977 | Takeda et al. | 358/128 |

Primary Examiner—Stuart N. Hecker

[57] ABSTRACT

An optical data recording system in which during recording the writing beam is made to move at the same velocity as the recording medium whereby motion blur is minimized or reduced. Movement of the writing beam at the same velocity as the recording medium is achieved by supplying a constantly varying frequency RF signal to an acousto-optic device which deflects (diffracts) the writing beam in accordance with the instantaneous frequency of the RF signal. The acousto-optic device can also be utilized to amplitude modulate the writing beam.

5 Claims, 4 Drawing Figures

MOTION BLUR COMPENSATION FOR MOVING MEDIA OPTICAL DATA RECORDING SYSTEM

BACKGROUND OF THE INVENTION

A motion blur problem can arise in those forms of optical data recorders in which the recording medium moves rapidly past the focused writing beam. If the pulse width is too long or the rise and/or fall time of the light beam modulator is too slow, the energy density incident upon the recording medium will be reduced, and the recorded spot size lengthened as a result of the recording medium motion during the switching time of the modulator. These effects increase writing power requirements and reduce data storage capacity. Reduction of motion blur by the use of very fast electro-optic modulators is possible, but that technique tends to be rather costly.

OBJECTS OF THE INVENTION

It is an object of the present invention to provide an improved optical data recording system.

It is another object of the present invention to provide an improved optical data recording system having significant improvements in spot size and usable energy density.

SUMMARY OF THE INVENTION

In accordance with the invention, motion blur problems are minimized or reduced by utilizing an acousto-optic modulator as a light beam deflector. The modulator is positioned in the writing beam optical path, and in such an orientation that a sweep of the frequency of the RF signal driving the modulator causes the writing beam to move in the direction of the moving recording medium. When the frequency sweep causes the writing beam to move in the same direction as the recording medium and at the same speed as the recording medium, the motion blur effect is eliminated. In the case of a disk writing system, only the tangential component of the recording medium motion can be exactly compensated for by a single acousto-optic modulator, but the radial component of the recording medium motion is negligible in practical cases. If desired, the acousto-optic modulator can also amplitude modulate the writing beam in accordance with the power level of the information signal supplied thereto.

DETAILED DESCRIPTION OF THE INVENTION

Figure 1:
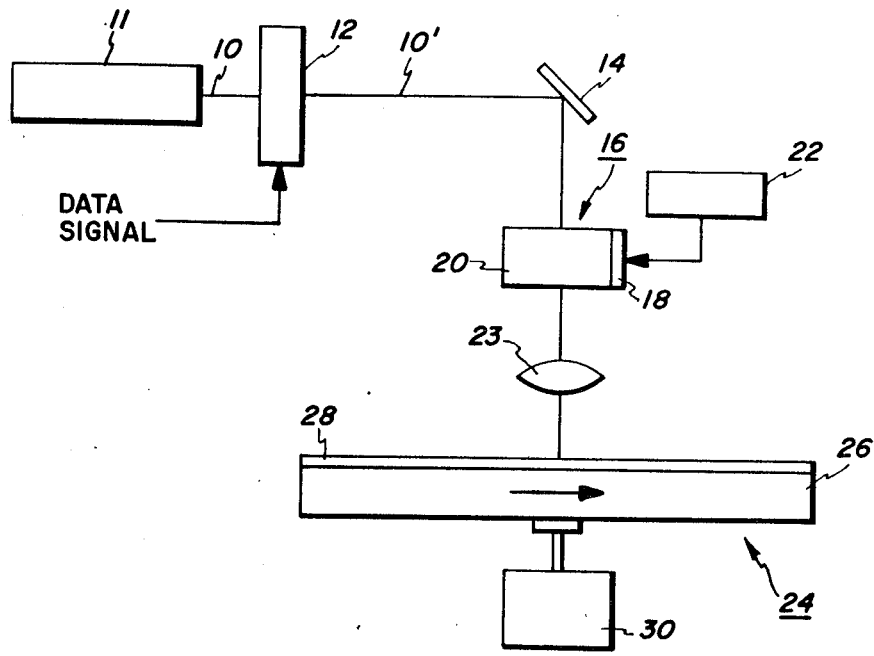
FIG. 1 is a schematic diagram of one embodiment of an optical memory system in accordance with the invention.

Referring to FIG. 1, a collimated light beam 10, such as produced, for example, by a helium-neon laser 11, is incident upon a modulator 12 which amplitude modulates light beam 10 in accordance with the data signal supplied thereto. The modulator 12 may be, for example, of the Pockels cell type which uses electro-optic crystals to effect the polarization of the laser beam as a direct function of the applied data signal voltage. Polarization modulation is then converted into intensity modulation by a polarization analyzer associated with the modulator. Other types of light modulators which respond to applied electrical signals to intensity modulate a light beam are well known and may be utilized instead of the Pockels cell type.

A mirror 14 directs the modulated light beam 10' upon an acousto-optic beam deflector 16 comprised, for example, of an electrically driven, piezo-electric transducer 18 bonded to an acousto-optic medium 20. The transducer 18 and acousto-optic medium 20 are of conventional materials and configuration; transducer 18 can be of lithium niobate, sodium niobate, quartz and the like, and acousto-optic medium 20 can be a ferroelectric material such as lead molybate or other high refractive index materials such as telluride glass and the like. The RF electrical signal supplied to the transducer 18 by variable frequency driver 22 produces acoustic strain waves within the acousto-optic medium 20 which modulate the refractive index of the acousto-optic medium 20 whereby the modulated light beam 10' is deflected (diffracted) in a preferred direction when the modulated light beam 10' is incident on the acousto-optic medium 20 near the Bragg angle and thus acts as a grating, the grating period being equal to the wavelength of the acoustic wave in the acousto-optic medium 20. Driver 22 is a conventional oscillator-mixer-amplifier capable of producing an electrical signal having a varying RF frequency between a minimum frequency and a maximum frequency, with reset capabilities back to the minimum frequency when the maximum frequency is reached.

After focusing by a writing lens 23, the amplitude and position modulated light beam 10' is incident upon a conventional optical memory device 24 comprised of a substrate disk 26 having on one surface thereof a storage or recording medium 28 in the form of a thin film, such as, for example, a film of bismuth on the order of 500 Å thick. During system operation, the optical memory is rotated at a constant speed by means of a drive motor 30. Light beam 10' produces a change in the optical characteristics of discrete, closely spaced portions of recording medium 28 thereby providing a record of the information conveyed by the data signal supplied to amplitude modulator 12.

As noted, a problem of motion blur can occur whenever writing a stream of high density data bits on a moving medium. In the case of optical data recording, such as recording on optical memory device 24, practically attainable rise and fall times of modulator 12 are often not short enough to produce efficient short pulses, thus causing significant loss of both writing spot definition and peak energy density due to the movement of optical memory device 24 during the writing or recording of information. For example, if the optical memory device 24 is a 12-inch disk travelling at 1800 RPM, the linear speed at the outer rim is about 0.29 $\mu$m/10ns. For a 1 micron hole (bit) size, the writing laser pulse width must be substantially less than 10 ns in order not to cause blurring of the recorded data due to motion of the recording medium during recording. Even with a 10 ns amplitude modulator rise time (already shorter than that available from commercial acousto-optic modulators) potentially serious growth of spot size and reduction of peak energy power can occur as a result of recording medium motion.

In accordance with the invention, motion blur is eliminated or minimized by use of acousto-optic beam deflector 16. The deflector 16 moves the laser beam as the data is being recorded on recording medium 28 in such a way that the laser spot is deflected to move at exactly the same tangential velocity as the recording medium area to be recorded upon to thereby obtain the same tangential velocity between the recording medium area to be recorded upon and the writing spot of the laser beam 10'. After an appropriate time, the writing spot can be either turned off by modulator 12 for the next "off" bit or quickly fly back (retrace) for the next "on" bit. In the foregoing example of an optical disk rotating at 1800 RPM, a typical bit spacing may be on the order of 1 μm, and a typical bit size may be 0.5 μm to 1 μm. In such a case, it may be reasonable to have the light beam 10' follow the disk motion for the majority of the bit-to-bit spacing, allowing the remaining time for a "retrace" interval.

The equality of tangential velocity between the area of the recording medium 28 to be recorded upon and the writing beam 10' is achieved by sweeping the frequency of the signal supplied to the transducer 18 of beam deflector 16. That is, the frequency of the RF signal supplied by driver 22 has a steady (linear) increase from a minimum frequency to a maximum frequency, with retrace after the maximum frequency is reached. It is well known that the angle of deflection, $\theta_L$, of an acousto-optic modulator can be varied by changing the RF drive frequency $f_a$ in accordance with the relationship $$\Delta \theta_L = (\lambda L/V_a) \Delta f_a \qquad (1)$$

where $\lambda_L$ is the wavelength of the modulated light beam 10' and $V_a$ is the velocity of propagation of the sound wave in the acousto-optic medium 20.

Figure 4:
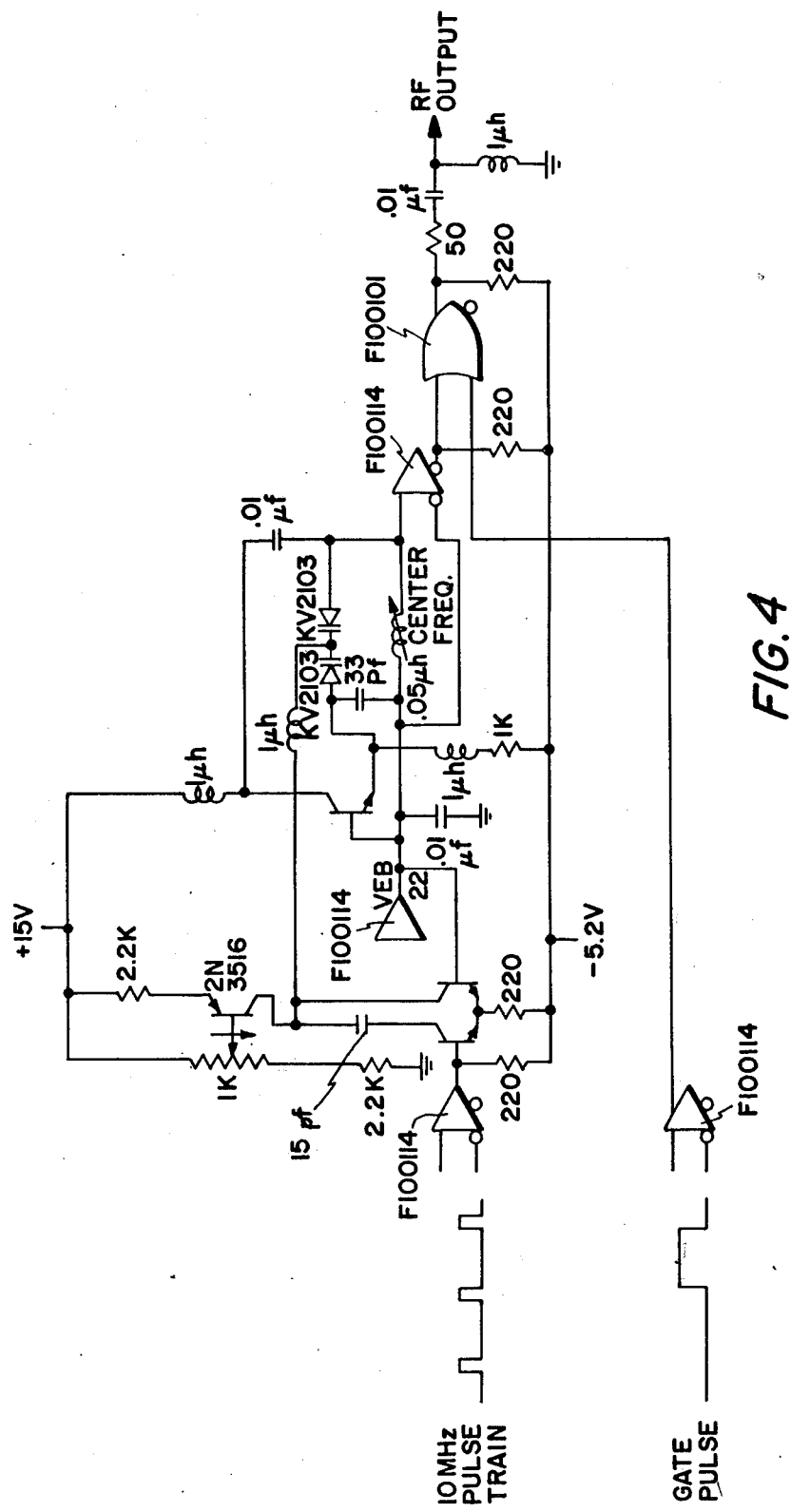
FIG. 4 is a schematic circuit diagram of a component of the systems of FIGS. 1 and 3.

If the writing beam is to track the periphery of a 12-inch disk travelling at 1800 RPM for a distance of 1 micron (which assumes a bit spacing of approximately 1 μm and a typical bit size of approximately 0.5 to 1.0 μm), the light beam 10' must be deflected through an angle equivalent to a two-spot deflector. Using a conventional acousto-optic modulator, such as a SORO M50M PbMoO₄ modulator having a velocity of propagation $V_a$ of 3.75 μm/ns, and a rise time of 25 ns, Eq. (1) indicates that the frequency of the signal supplied by driver 22 would have to undergo a linear frequency sweep of about 50 MHz in order that the focused light beam tracks exactly with the moving recording medium. An oscillator which can produce such a frequency sweep is shown schematically by FIG. 4.

Figure 2:
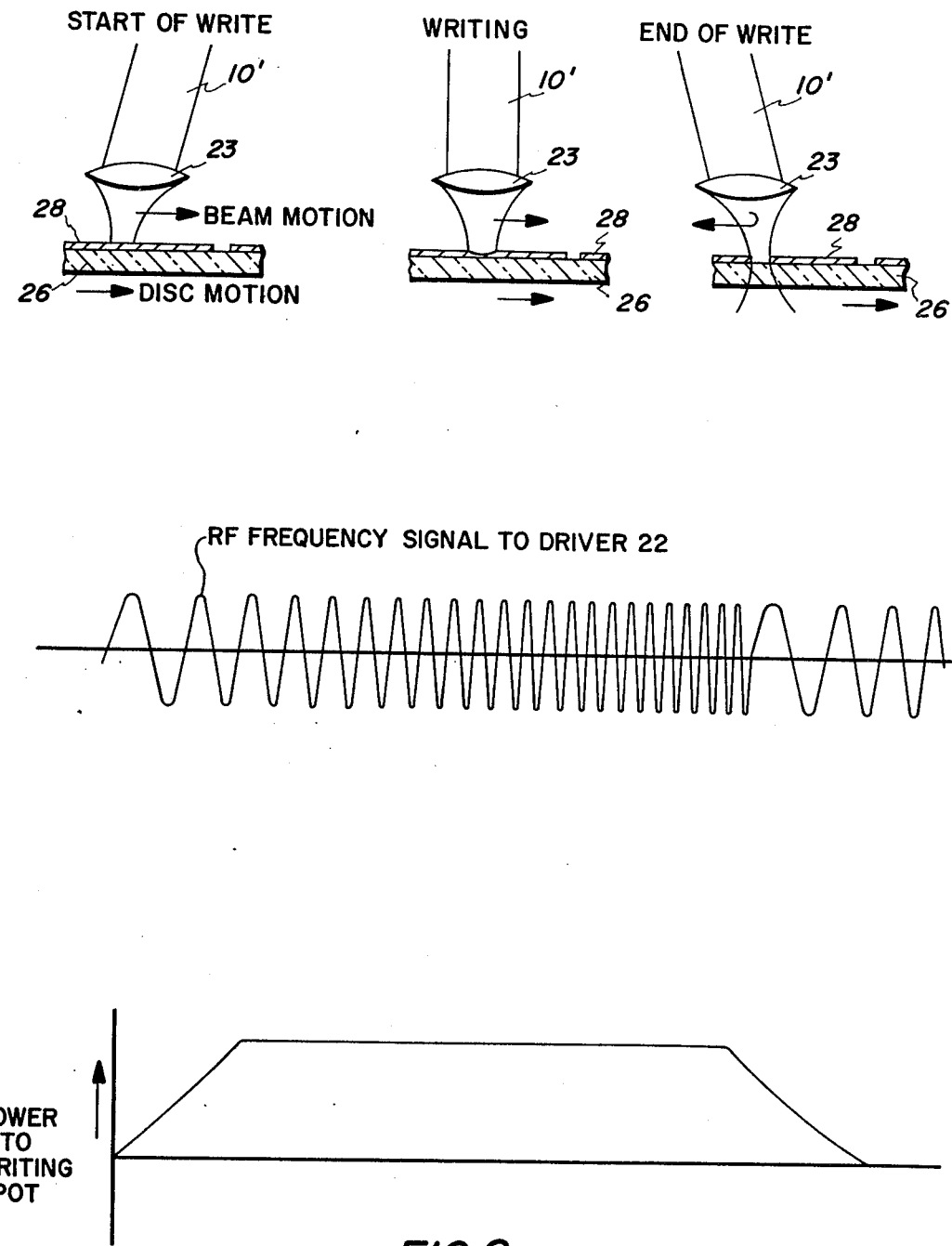
FIG. 2 shows schematically the time sequence of data writing of the system of FIG. 1.

Referring now to FIG. 2, there is shown schematically for a common time reference the position of writing beam 10', the frequency of the RF signal supplied by driver 22, and the power into the writing spot. It can be seen that the writing beam tracks the write position exactly as the radio frequency of the signal supplied by driver 22 is steadily increased.

Figure 3:
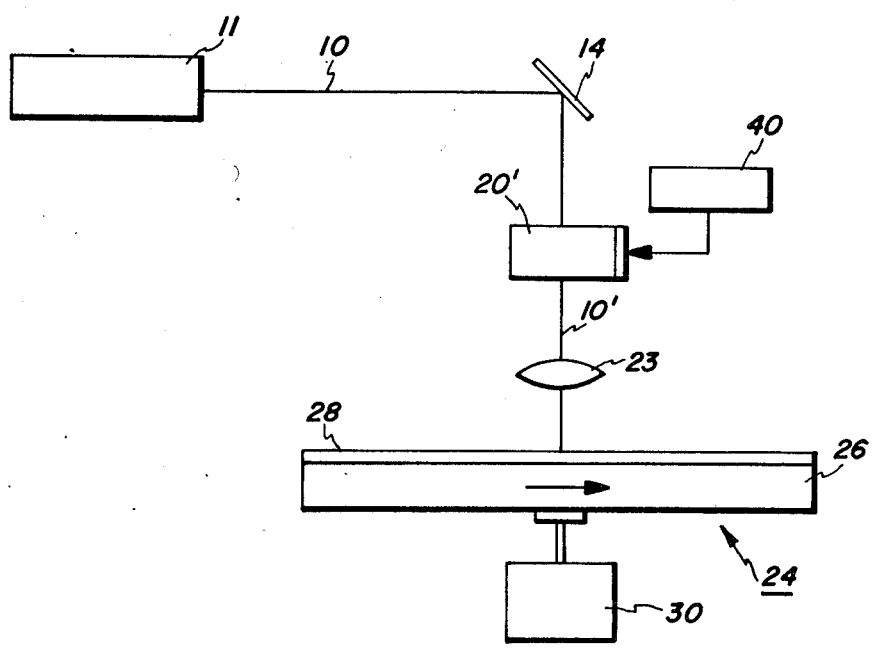
FIG. 3 is a schematic diagram of another embodiment of an optical memory system in accordance with the invention.

In the embodiment of FIG. 1, amplitude modulation of the laser beam is provided by modulator 12 and deflection of the modulated laser beam is provided by acousto-optic beam deflector 16. The amplitude modulation and deflection functions can also be provided by a single acousto-optic device as shown in FIG. 3 wherein the acousto-optic device 21 receives from source 40 a variable power signal that has a frequency sweep when the signal is at full power. Operating in a conventional manner, the acousto-optic device 21 permits transmission of the laser beam when the signal from source 40 is at full power and prevents transmission of the laser beam when the signal from source 40 is off or at low power whereby amplitude modulation of the laser beam is achieved. When at full power, the signal from source 40 has a steadily increasing or sweeping frequency which causes deflection of the light beam transmitted by acousto-optic device 21 to provide tracking with the moving recording medium.

The invention is not limited to the ablation-type recording shown in FIG. 2, but is equally applicable to recording by changing the optical characteristics of the recording medium by means other than ablation.

From the foregoing it can be seen that a substantial increase in exposure time and hence available writing energy is achieved. The power utilization for each bit written is about 75% for a modulator with a rise time equal to a quarter of the pulse period versus 25% for the conventional stationary spot recording system. Another advantage of the de-blurring systems previously discussed is that the speed of the spot movement is controlled only by the rate of change of the frequency of the RF frequency signal supplied to the deflector. In the case of optical disk writing, this rate can be programmed in a conventional manner so that the spot movement is controlled exactly in step with the disk at all radii, although the tangential velocities are quite different for different radii.

In the optical data recording systems previously described, the laser 10 was operating cw. In those systems, the steady laser power is totally wasted when no "zero" bits are recorded. Since the power needed to record on an optical memory can be efficiently conveyed by a cavity dumped laser output having a pulse duration of only 10 to 20 ns for a laser having a given cw power, the amount of time needed to record an information bit can be substantially less with a cavity dumped laser than with a laser operating cw. Thus, using a cavity dumped laser in the systems of FIGS. 1 and 3 would permit the laser beam to follow the motion of the area of the recording medium to be recorded upon for a lesser distance and hence would require a smaller percentage frequency sweep by the driver.

We claim:

1. In an optical memory system including means for producing a light beam of high intensity, a material capable of having the optical characteristics of discrete areas thereof modified by a high intensity light beam, means for rotating said material, and means for directing said high intensity light beam so that it is incident upon discrete areas of said material when said material is rotating, the improvement comprising:

means for deflecting said high intensity light beam such that when said material is rotating said light beam has a motion substantially equal to at least a component of motion of a discrete area of said material whereby motion blur is minimized.

2. The optical memory system of claim 1 wherein said means for deflecting is an acousto-optic modulator driven by a constantly varying RF signal during the time that said high intensity light beam is incident upon said discrete area of said material.

3. The optical memory system of claim 1 wherein said material is in the form of a disk and said motion of said light beam is substantially equal to the tangential component of motion of said discrete area of said material.

4. In an optical memory system for storing data, said system including
- means for producing a light beam,
- means for intensity modulating said light beam in accordance with said data so that the intensity of said light beam swings between a relatively high level and a relatively low level to represent said data,
- a disk-like recording medium composed of a material having an optical characteristic which changes in discrete areas when said areas are exposed to the high intensity level of said light beam,
- means for rotating said recording medium at a predetermined rate about a predetermined axis of rotation, and
- means for focusing said intensity modulated light beam on said recording medium at progressively varying radial distances from said axis of rotation to write said data on said recording medium;

the improvement comprising means for deflecting said light beam while data is being written on said recording medium at a rate and in a direction substantially equal to at least one of the components of motion the discrete areas of said recording medium experience while said data is being written thereon, whereby motion blurring of said data is reduced.

5. The improvement of claim 4 wherein the deflection of said light beam is at a rate and in a direction substantially equal to the tangential component of motion of the discrete area of said recording medium upon which said light beam is focused while data is being written.

* * * * *